US011532866B2

(12) United States Patent
Menon et al.

(10) Patent No.: US 11,532,866 B2
(45) Date of Patent: Dec. 20, 2022

(54) CELLULAR BASE STATION GROUND COMPONENT MOUNTING SYSTEM

(71) Applicant: DISH Wireless L.L.C., Englewood, CO (US)

(72) Inventors: Anand Menon, Lone Tree, CO (US); Richard Ripp, Jr., Englewood, CO (US)

(73) Assignee: DISH Wireless L.L.C., Englewood, CO (US)

( * ) Notice: Subject to any disclaimer, the term of this patent is extended or adjusted under 35 U.S.C. 154(b) by 0 days.

(21) Appl. No.: 17/025,758

(22) Filed: Sep. 18, 2020

(65) Prior Publication Data

US 2021/0408663 A1 Dec. 30, 2021

Related U.S. Application Data

(60) Provisional application No. 63/043,448, filed on Jun. 24, 2020.

(51) Int. Cl.
*H01Q 1/12* (2006.01)
*H01Q 1/20* (2006.01)
*E02D 5/80* (2006.01)

(52) U.S. Cl.
CPC ............ *H01Q 1/1207* (2013.01); *H01Q 1/20* (2013.01); *E02D 5/80* (2013.01)

(58) Field of Classification Search
CPC ....... E02D 5/80; E02D 5/801; E04H 12/2215; A01G 9/122; A45F 3/44; H01Q 1/1264; H01Q 1/1235; H01Q 19/13; H01Q 3/08; H01Q 1/1207

USPC ........ 248/545, 688, 530, 156, 370, 507, 508
See application file for complete search history.

(56) References Cited

U.S. PATENT DOCUMENTS

| 1,902,423 | A | * | 3/1933 | Seltzer | A47G 7/025 47/39 |
| 3,752,476 | A | * | 8/1973 | Mahoney | A63B 69/0097 473/435 |
| 4,714,225 | A | * | 12/1987 | Skinner | H01Q 1/1242 248/523 |
| 6,181,244 | B1 | * | 1/2001 | Hall | G08B 25/10 340/539.1 |
| 6,328,273 | B1 | * | 12/2001 | Kemikem | E04H 12/2223 248/121 |
| 7,205,956 | B1 | * | 4/2007 | Sychaleun | H01P 3/12 333/248 |

(Continued)

FOREIGN PATENT DOCUMENTS

WO WO-2018094555 A1 * 5/2018 ........... H01Q 1/2291

*Primary Examiner* — Christopher Garft
*Assistant Examiner* — Michael McDuffie
(74) *Attorney, Agent, or Firm* — Kilpatrick Townsend & Stockton, LLP (57) ABSTRACT

Various cellular base station ground component mounting systems are presented herein. Such a system can include a cellular component cabinet configured to house a plurality of components of a cellular base station. The cellular component cabinet can define cabinet mounting holes. Such a system can include a support structure that defines mounting holes that correspond to the cabinet mounting holes of the cellular component cabinet. The system can include a stabilization structure that defines earth anchor mounting holes configured to receive earth anchors to anchor the mounting platform to the ground.

20 Claims, 8 Drawing Sheets

(56) References Cited

U.S. PATENT DOCUMENTS

| | | | | |
|---|---|---|---|---|
| 7,938,384 B2* | 5/2011 | Stevens | ................ | E04H 12/20 |
| | | | | 254/233 |
| 8,839,572 B2* | 9/2014 | Lee | ................ | E04H 17/263 |
| | | | | 52/165 |
| 8,938,905 B1* | 1/2015 | Moore | ................ | A41G 1/007 |
| | | | | 43/2 |
| 9,698,477 B1* | 7/2017 | Jabara | ................ | H01Q 1/1228 |
| 9,890,551 B1* | 2/2018 | Delao | ................ | E04H 12/2215 |
| 10,124,268 B1* | 11/2018 | Wicken | ................ | F16M 11/08 |
| 10,418,685 B1* | 9/2019 | Campbell | ................ | F16M 13/02 |
| 10,767,385 B2* | 9/2020 | Wehr | ................ | E04H 12/2215 |
| 10,950,921 B2* | 3/2021 | Norrell | ................ | H01Q 1/1242 |
| 2007/0200046 A1* | 8/2007 | Tota | ................ | E04H 12/2253 |
| | | | | 248/545 |
| 2007/0252701 A1* | 11/2007 | Berry | ................ | H01Q 1/088 |
| | | | | 340/572.7 |
| 2007/0267552 A1* | 11/2007 | Meyer | ................ | E04H 12/2261 |
| | | | | 248/156 |
| 2008/0307721 A1* | 12/2008 | Schultz | ................ | E04H 12/2215 |
| | | | | 52/157 |
| 2009/0090836 A1* | 4/2009 | Harris | ................ | E04H 12/2238 |
| | | | | 248/530 |
| 2010/0200724 A1* | 8/2010 | Kukuk | ................ | A45B 25/00 |
| | | | | 248/530 |
| 2015/0013261 A1* | 1/2015 | Kolokotronis | ................ | B23P 15/00 |
| | | | | 52/651.07 |
| 2018/0219278 A1* | 8/2018 | Wigdahl | ................ | H01Q 1/42 |
| 2018/0241132 A1* | 8/2018 | Gambahaya | ................ | H01Q 1/1207 |

* cited by examiner

CELLULAR BASE STATION GROUND COMPONENT MOUNTING SYSTEM

CROSS-REFERENCE TO RELATED APPLICATIONS

This application claims priority to U.S. Provisional Patent Application No. 63/043,448, filed on Jun. 24, 2020, entitled "Cellular Base Station Ground Component Mounting System," the disclosure of which is hereby incorporated by reference in its entirety for all purposes.

BACKGROUND

When a cellular base station is constructed, a cellular tower is typically constructed onto which one or more antennas are mounted for one or more cellular communication networks. Accompanying the cellular tower are base station components, such as cellular radios, cellular transceivers, signal amplifiers, combiners, and/or one or more computer server systems, which can serve as a system controller. Typically, at least some of these components are installed in a cellular component cabinet or housing adjacent the cellular tower.

Installation of a cellular component cabinet nearby the cellular tower can be a multi-day process. A concrete pad may be poured and would need to cure for at least one day before a cellular component cabinet is installed atop the pad. Such an arrangement would therefore require that one or more installers travel to and work on the installation site on multiple different days. From an efficiently standpoint, a mounting system for the cellular component cabinet that allows for installation to be completed in one site visit and/or a shorter overall time period may be beneficial.

SUMMARY

Various embodiments are described related to a cellular base station ground component mounting system. In some embodiments, a cellular base station ground component mounting system is described. The system may comprise a cellular component cabinet configured to house a plurality of components of a cellular base station. The cellular component cabinet may define a plurality of cabinet mounting holes. The cellular component cabinet may have a first footprint. The cellular component cabinet may have a mounting platform. The mounting platform may define a support structure that may define a plurality of mounting holes that may correspond to the cabinet mounting holes of the cellular component cabinet. The mounting platform may define a stabilization structure that may define a plurality of earth anchor mounting holes configured to receive earth anchors to anchor the mounting platform to earth. A second footprint of the mounting platform may be larger than the first footprint of the cellular component cabinet. The support structure may be attached with an encircled by the stabilization structure.

Embodiments of such a method may include one or more of the following features: no concrete pad may be present beneath the cellular component cabinet or the mounting platform. The stabilization structure may be triangular and the support structure may comprise three supports that anchor the plurality of mounting holes with the plurality of earth anchor mounting holes. The stabilization structure may be circular and the support structure may comprise three supports that anchor the plurality of mounting holes with the plurality of earth anchor mounting holes. The three supports may be arranged 120° apart within the stabilization structure. The cellular component cabinet may comprise a first port to connect with a fiber optic network and a second port to connect with components mounted on a cellular tower. The cellular component cabinet may house 5G NR (New Radio) cellular network components. The system may further comprise an electric meter that may be mounted external to the cellular component cabinet. The electric meter may be mounted on top of the cellular component cabinet. The cellular component cabinet may be cylindrical.

In some embodiments, a method for securely mounting cellular base station ground components is described. The method may comprise attaching a cellular component cabinet with a mounting platform. The cellular component cabinet may be configured to house a plurality of components of a cellular base station. The cellular component cabinet may define a plurality of cabinet mounting holes. The cellular component cabinet may have a first footprint. The mounting platform may comprise a support structure that may define a plurality of mounting holes that correspond to the cabinet mounting holes of the cellular component cabinet. The mounting platform may further comprise a stabilization structure that may define a plurality of earth anchor mounting holes configured to receive earth anchors to anchor the mounting platform to earth. A second footprint of the mounting platform may be larger than the first footprint of the cellular component cabinet. The support structure may be attached with and encircled by the stabilization structure. The method may comprise anchoring the mounting platform by inserting ground anchors through the plurality of earth anchor mounting holes into the ground.

Embodiments of such a method may include one or more of the following features: anchoring the mounting platform may be performed with no concrete pad present beneath the cellular component cabinet or the mounting platform. The stabilization structure may be triangular and the support structure may comprise three supports that fix the plurality of mounting holes with the plurality of earth anchor mounting holes. The stabilization structure may be circular and the support structure may comprise three supports that fix the plurality of mounting holes with the plurality of earth anchor mounting holes. The three supports may be arranged 120° apart within the stabilization structure. The method may further comprise connecting a first port of the cellular component cabinet to a fiber optic cable and a second port of the cellular component cabinet to components mounted on a cellular tower. The cellular component cabinet may house 5G NR (New Radio) cellular network components. The method may further comprise mounting an electric meter external to the cellular component cabinet. The electric meter may be mounted on top of the cellular component cabinet.

In some embodiments, a cellular base station system is described. The system may comprise one or more cellular antennas. The system may comprise a cellular tower. The system may comprise a cellular component cabinet configured to house a plurality of components of a cellular base station. The cellular component cabinet may define a plurality of cabinet mounting holes. The cellular component cabinet may have a first footprint. The cellular component cabinet may define a first port and a second port. The first port may be connected with a fiber optic network and the second port may be connected with the one or more cellular antennas mounted on the cellular tower. The system may comprise a mounting platform. The mounting platform may define a support structure that may define a plurality of mounting holes that may correspond to the cabinet mounting holes of the cellular component cabinet. The mounting platform may define a stabilization structure that may define a plurality of earth anchor mounting holes configured to receive earth anchors to anchor the mounting platform to earth. A second footprint of the mounting platform may be larger than the first footprint of the cellular component cabinet. The support structure may be attached with and encircled by the stabilization structure.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A multi-surface ground anchor system can permit a cellular component cabinet to be installed in a location without a concrete pad (or other rigid flat surface, such as asphalt) first needing to be constructed. Rather, the multi-surface ground anchor system may use ground anchors to directly anchor the cellular component cabinet into the earth (e.g., dirt, soil). Further, the multi-surface ground anchor system may use relatively flat supports that can be anchored using ballast if drilling into the surface on which the cellular component cabinet is to be mounted is undesirable (e.g., the cellular component cabinet is being mounted on a roof of a building).

Such a multi-surface ground anchor system can allow for one or more installers to install the cellular component cabinet in a significantly shorter time frame and/or can involve fewer site visits to accomplish installation. For instance, in a single site visit, it would be possible for one or more installers to fully install and connect a cellular component cabinet as part of a cellular base station. Specifically, by not requiring the installation of concrete (or other material that needs time to cure), the cellular component cabinet can be fully installed in a single site visit.

Such expedited installation may be particularly important for 5G NR (New Radio) based cellular base stations. 5G cellular base stations may need to be installed at significantly closer distance intervals at least in part due to their use of higher frequencies for communication with user equipment. Therefore, for a given geographic area, a larger number of base stations may need to be installed for a 5G cellular network than for previous generations of cellular networks. This requirement for a larger number of base stations can result in new base stations needing to be erected to provide service. For example, in a residential neighborhood, a relatively small 5G tower may be erected on the road verge, which is the space between a sidewalk and the street. Typically, the road verge is covered in grass, plants, loose rock, or some other material. This region is typically maintained by a homeowner; therefore, the specific material present can vary from property to property. Therefore, in order to install a 5G cellular base station, some form of mounting platform is needed to secure the cellular component cabinet to the ground. Such a mounting platform may be designed in order to decrease the likelihood of a pedestrian tripping when walking nearby.

Figure 1:
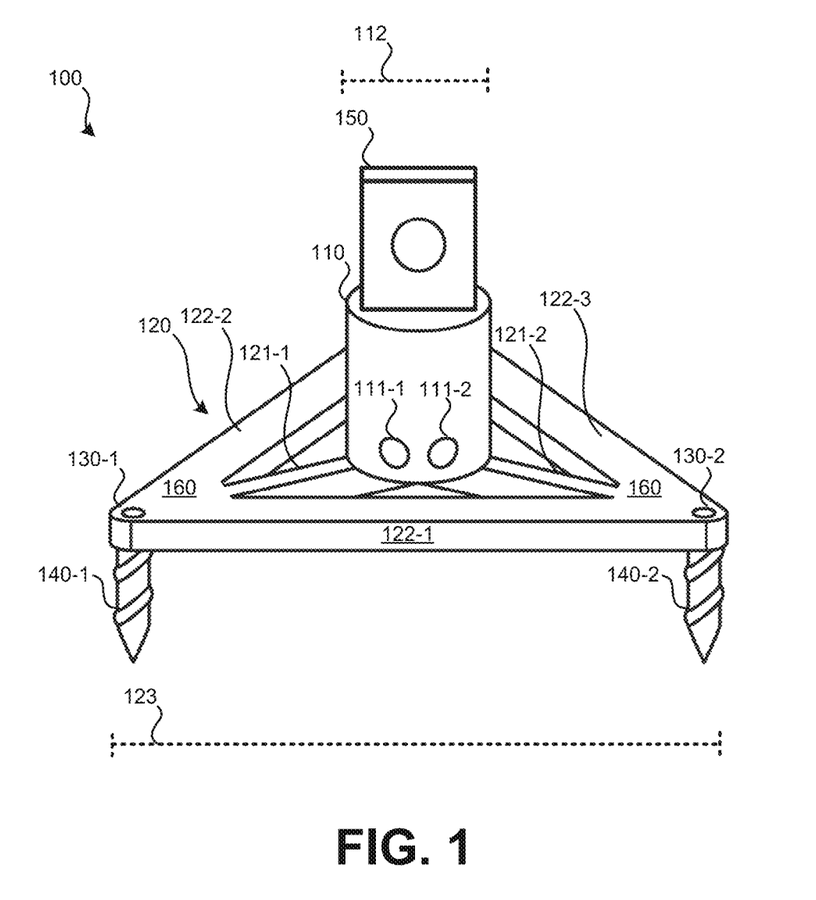
FIG. 1 illustrates a front perspective view of a triangular cellular component cabinet mounting system.

Embodiments detailed herein are focused on ground component mounting systems that can be used in conjunction with a cellular tower, such as a 5G cellular tower, to install and securely mount a cellular component cabinet without requiring a concrete pad or similar rigid surface for mounting. FIG. 1 illustrates a front perspective view of a triangular cellular component cabinet mounting system 100 (hereinafter "system 100"). System 100 can include: cellular component cabinet 110 ("cabinet 110"); mounting platform 120 ("platform 120") that includes a support structure and a stabilization structure; support structure supports 121 ("supports 121"); ground anchor mounting points 130; earth anchors 140; and electric meter 150.

Cabinet 110 may have various shapes; however, a cylindrical shape may be beneficial for wind loading purposes. Regardless of the direction that wind comes from, a cylindrical shape may help decrease the wind load exerted on cabinet 110 and, thus, force applied to mounting platform 120. Cabinet 110 may have an access panel for the installation and maintenance of internal components. Such internal components can include: cellular radios (e.g., 5G NR radios); cellular transceivers; signal amplifiers; fiber optic transceivers; combiners; and/or one or more computer server systems. The internal components for more than one cellular network provider may be housed within cabinet 110. Cabinet 110 may have at least two ports 111. Port 111-1 may serve as a connection for fiber optic cable of the cellular network. The base station may function as a gNodeB of the 5G NR cellular network. The fiber optic connection may connect with the core network of the cellular network. Port 111-2 may serve as an output to one or more antennas (and, possibly, one or more cellular radios) attached atop the cellular tower. Therefore, in some embodiments, three ports are present: a first port to connect with the cellular core network; a second port to connect with the antennas (or radios); and a third port for electrical service. In other embodiments, a greater number of ports are present.

In some embodiments, it may be possible for cabinet 110 to be fully configured with internal components prior to arrival at the installation site. Therefore, upon cabinet 110 being delivered to the site of the base station, cabinet 110 may only need to have ports 111 connected and be anchored to platform 120.

Platform 120 may be constructed from a rigid material, such as steel or aluminum. In some embodiments, platform 120 is triangular in shape. Platform 120 can include stabilization structure 122 and a support structure. The support structure can include supports 121 (of which three may be present, with two visible in FIG. 1) which connect the stabilization structure of platform 120 with cabinet 110. Cabinet 110 may sit atop supports 121 and may be anchored to supports 121 via fasteners, such as bolts. Platform 120 may be sized such that the footprint of platform 120 is significantly larger than the footprint of cabinet 110. Such sizing allows platform 120 to resist tipping due to torque exerted on cabinet 110 (and/or electric meter 150). In some embodiments, cabinet 110 is 40 inches in diameter, represented by distance 112. In other embodiments, cabinet 110 is narrower or wider. Distance 112 may be significantly larger than the diameter of cabinet 110, such as at least 100% greater in order to provide sufficient support.

Stabilization structure 122 may include multiple perimeter supports, such as supports 122-1, 122-2, and 122-3. Stabilization structure 122 can define some number of mounting points 130 for earth anchors to pass through platform 120 and anchor platform 120 to the ground. In a triangular platform design, three mounting points 130 (of which 130-1 and 130-2 are visible) may be present. Earth anchors 140 may be sufficiently sized to hold platform 120 and cabinet 110 in place despite wind and other force being applied to cabinet 110 (and, possibly, electric meter 150). For instance, earth anchors 140 may be 18 inches to 3 feet in length. Earth anchors may be designed to drill into and anchor in porous earth, such as in and through dirt, clay, sod, etc.

In some installations, using earth anchors, or any sort of fasteners, may be unadvisable, such as if platform 120 is to be installed on a roof of a building. Rather, some form of ballast, such as sandbags or cinderblocks, may be used. Top surface 160 of platform 120 may be flat or relatively flat to accommodate ballast being placed atop top surface 160. Top surface 160 may be flat or relatively flat on the entirety of platform 120 to accommodate ballast at any location an installer desires such ballast to be present.

In order for the internal components of cabinet 110 to be powered, electrical service may be required. A power company may require that electric meter 150 be installed to log the amount of electricity used. Electric meter 150 may be attached atop cabinet 110 or in some other location on or near cabinet 110. As illustrated, power cabling may exit a bottom of electric meter 150 into cabinet 110. In other embodiments, a port, similar to ports 111, may be placed in another location on cabinet 110 for electrical service from electric meter 150.

Figure 2:
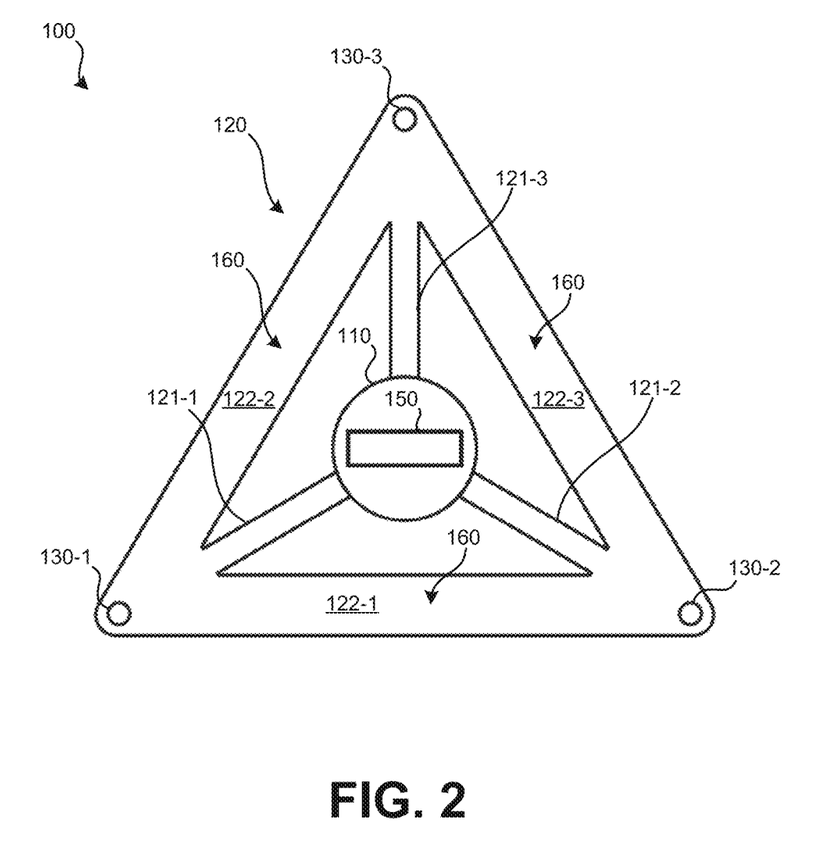
FIG. 2 illustrates a top view of a triangular cellular component cabinet mounting system.

FIG. 2 illustrates a top view of a triangular cellular component cabinet mounting system 100. From a top view, three supports 121 (121-1, 121-2, and 121-3) are visible. In other embodiments, a greater number of supports 121 may be present. Similarly, three mounting points 130 for earth anchors are visible. In other embodiments, a greater number of anchor points may be present in platform 120.

Figure 3:
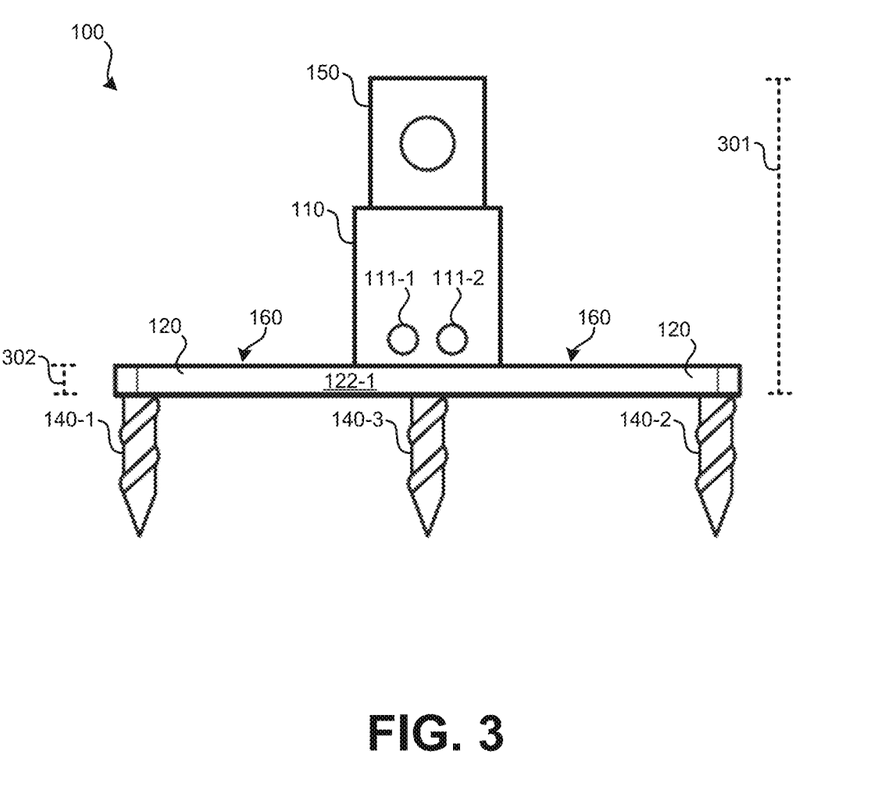
FIG. 3 illustrates a front view of a triangular cellular component cabinet mounting system.

FIG. 3 illustrates a front view of a triangular cellular component cabinet mounting system 100. The total height 301, above ground, of system 100, including electric meter 150, may be about three feet. It may be desirable for the height to be significant enough that a pedestrian will likely see cabinet 110 and electric meter 150 and not trip or walk into system 100. In other embodiments, the height may be greater or smaller. Thickness 302 of platform 120 may be 0.5 inches. Such a thickness may provide sufficient rigidity and may decrease the possibility that a pedestrian trips on an edge of platform 120. In other embodiments, platform 120 may be between 0.2 inches and 1.5 inches thick. A thickness may be determined based at least in part on the total height 301; that is, the greater the height, the greater the thickness needed to resist lateral force applied to cabinet 110 and/or electric meter 150.

Figure 4A:
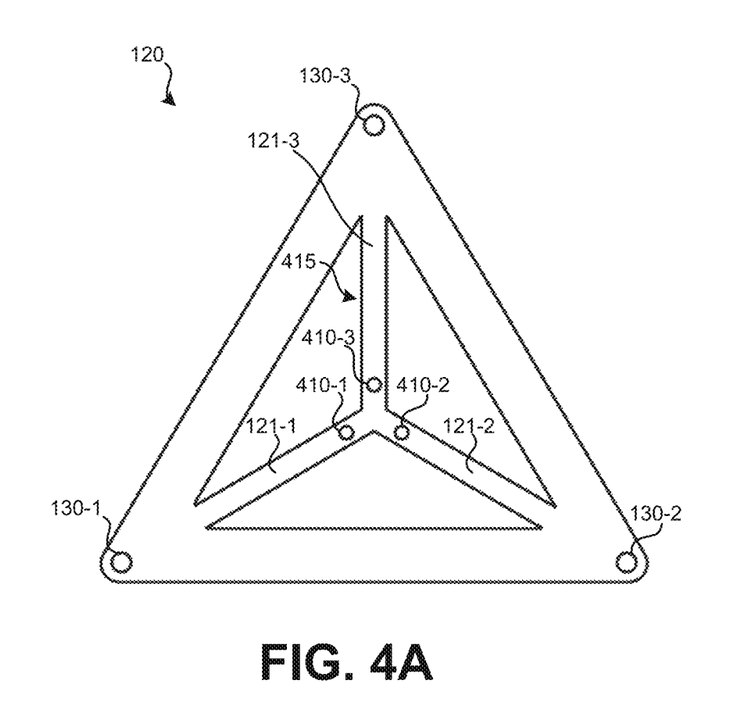
FIG. 4A illustrates a top view of a triangular mounting platform.

FIG. 4A illustrates a top view of a mounting platform 120 (with the cellular component cabinet and electric meter removed). Visible in FIG. 4A are cabinet mounting points 410 which are defined by support structure 415, which includes supports 121. Cabinet mounting points 410 allow for fasteners, such as nuts and bolts, to be used to fasten cabinet 110 (via corresponding mounting holes or points of cabinet 110) to platform 120. Supports 121 serve to secure cabinet mounting points 410 (or holes) with earth anchor mounting points 130, which have a significantly greater radius from a center of platform 120 (thus providing stability against tipping). Due to fasteners being used to perform this attachment, the fastening can be performed on-site. Alternatively, welding or some other form of attaching may be performed between platform 120 and cabinet 110. The number of cabinet mounting points 410 may vary by embodiment. In some embodiments, a sub-platform that matches or nearly matches the footprint of cabinet 110 may be present around cabinet mounting points 410 such that cabinet 110 has a flat surface on which to be seated.

Figure 4B:
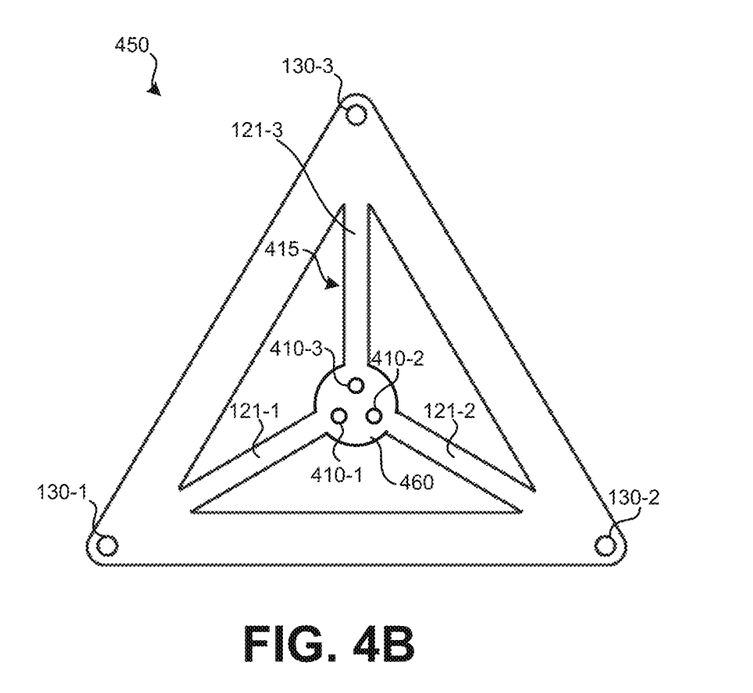
FIG. 4B illustrates a top view of an embodiment of a triangular mounting platform that includes a support plate.

FIG. 4B illustrates a top view of another embodiment of mounting platform 120 (with the cellular component cabinet and electric meter removed). Visible in FIG. 4B are cabinet mounting points 410 which are defined by support structure 415, which includes supports 121. Cabinet mounting points 410 allow for fasteners, such as nuts and bolts, to be used to fasten cabinet 110 (via corresponding mounting holes or points of cabinet 110) to platform 120. In the illustrated embodiment of FIG. 4B, support structure 415 further includes support plate 460. Support plate 460 defines cabinet mounting points 410 and is attached with supports 121. Support plate 460 may be circular, triangular, or some other shape. Support plate 460 may be a same thickness of supports 121 to allow the cellular component cabinet to sit flush atop platform 450. The remaining components present in FIG. 4B may function as detailed in relation to FIG. 4A.

Figure 5:
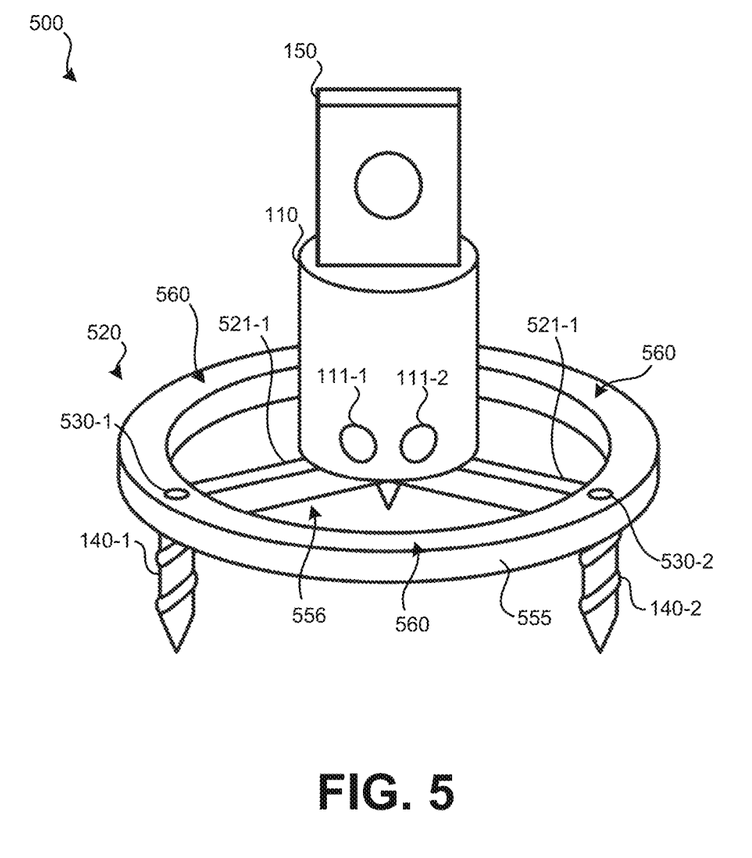
FIG. 5 illustrates a front perspective view of a circular cellular component cabinet mounting system.

In other embodiments, the shape of the stabilization structure of platform 120 may be other than triangular. For instance, rectangular, square, hexagonal, or circular shapes may be used. FIG. 5 illustrates a front perspective view of a circular cellular component cabinet mounting system 500 ("system 500"). System 500 can include: cabinet 110; mounting platform 520 ("platform 520"); mounting platform supports 521 ("supports 521"); mounting points 530; earth anchors 140; and electric meter 150. Cabinet 110 and electric meter 150 may be as described in relation to FIGS. 1-4.

Platform 520 may be constructed from a rigid material, such as steel or aluminum. Platform 520 may be circular in shape. Platform 520 may include stabilization structure 555 and support structure 556. Support structure 556 can include supports 521 (of which three may be present, with two visible in FIG. 1) may connect the stabilization structure of platform 520 with cabinet 110. Cabinet 110 may sit atop supports 521 and may be anchored to supports 521 via fasteners, such as nuts and bolts. Platform 520 may be sized such that footprint 123 of stabilization structure 555 is significantly larger than the footprint of cabinet 110. Such sizing allows platform 520 to resist tipping due to torque exerted on cabinet 110 (and/or electric meter 150), such as by wind.

Stabilization structure 555 of platform 520 may include some number of mounting points 530 for earth anchors to pass through platform 520 and anchor platform 520 to the ground. In a circular platform design, three mounting points 530 (of which 530-1 and 530-2 are visible) may be present. It may be possible for an installer to drill additional mounting points into stabilization structure 555 and support structure 556 of platform 520 as needed. Additionally or alternatively, additional mounting points 530 may be pre-drilled in platform 520. Earth anchors 140, as detailed in relation to FIG. 1, may be sufficiently sized to hold platform 520 and cabinet 110 in place despite wind and other force being applied to cabinet 110 (and, possibly, electric meter 150).

In some installations, using earth anchors, or any sort of fasteners, may be unadvisable. Rather, some form of ballast, such as sandbags or cinderblocks may be used. Top surface 560 of platform 520 (which includes the top surfaces of stabilization structure 555 and support structure 556) may be flat or relatively flat to accommodate ballast being placed atop top surface 560. Top surface 560 may be flat or relatively flat on the entirety of platform 520 to accommodate ballast at any location an installer desires such ballast to be present.

Figure 6:
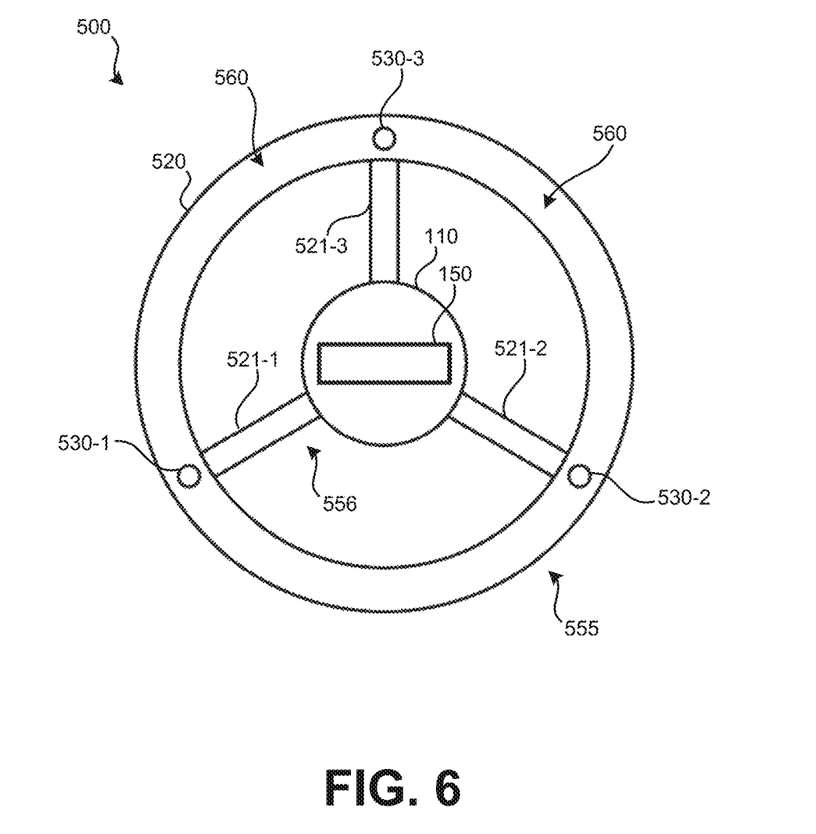
FIG. 6 illustrates a top view of a circular cellular component cabinet mounting system.
Figure 7:
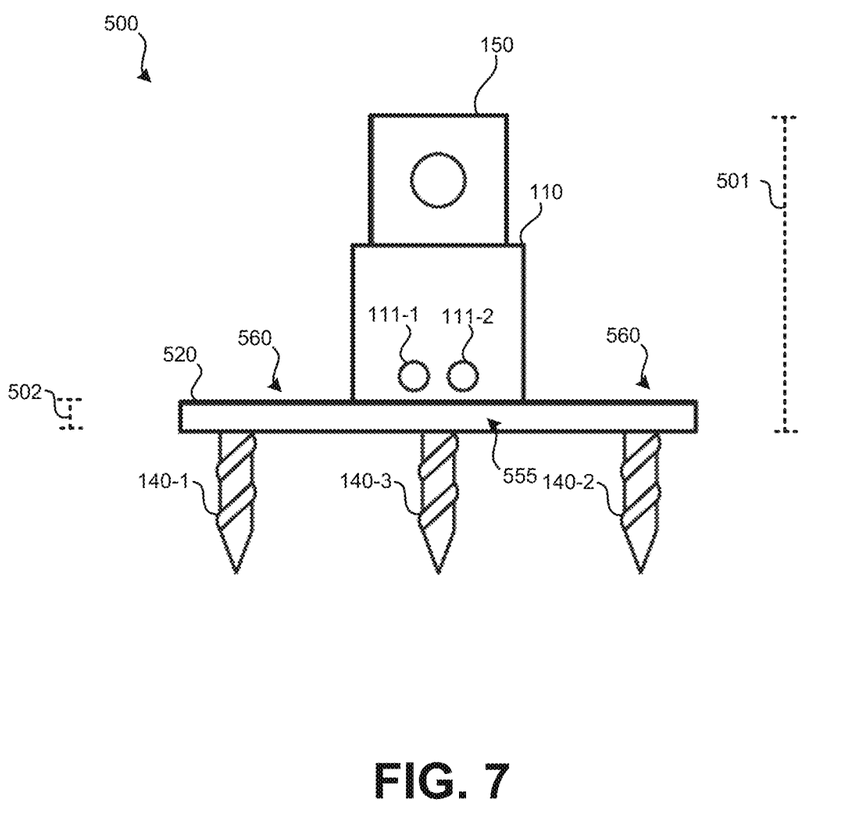
FIG. 7 illustrates a front view of a circular cellular component cabinet mounting system.

FIG. 6 illustrates a top view of a circular cellular component cabinet mounting system 500. From a top view, three supports 121 of support structure 556 are visible. In other embodiments, a greater number of supports 521 may be present. Similarly, three mounting points 530 defined by stabilization structure 555 are visible. In other embodiments, a greater number of anchor points may be present in platform 520. FIG. 7 illustrates a front view of a circular cellular component cabinet mounting system 500. Total height 501, above ground, of system 500, including electric meter 150, may be about three feet. It may be desirable for the height to be significant enough that a pedestrian will likely see cabinet 110 and electric meter 150 and not trip or walk into system 500. In other embodiments, the height may be greater or smaller. Thickness 502 of platform 520 may be 0.5 inches. Such a thickness may provide sufficient rigidity and may decrease the possibility that a pedestrian trips on an edge of platform 520. In other embodiments, platform 520 may be between 0.2 inches and 1.5 inches thick. A thickness may be determined based at least in part on the total height 501; that is, the greater the height, the greater the thickness needed to resist lateral force applied to cabinet 110 and/or electric meter 150.

Whether the stabilization structure of the platform is circular, triangular, or some other shape, an installer may secure the platform to the earth using ground anchors or to another type of surface using ballast. The installer may then attach the cabinet to the platform. Alternatively, the platform may be attached with the cabinet before being secured to the ground or other surface. The installer may then attach network and antenna (and/or radio) cabling to the respective ports. The installer may also connect electrical service. Those tasks may be the only tasks that need to be performed on-site. For instance, components within the cabinet may have been preconfigured prior to the cabinet being delivered to the installation site.

Figure 8:
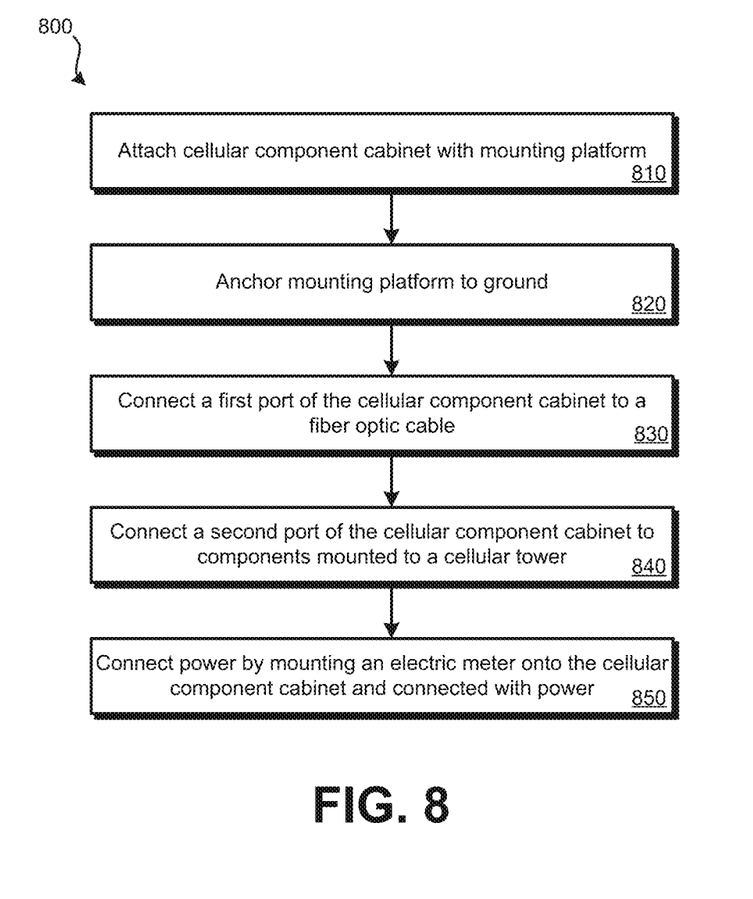
FIG. 8 illustrates an embodiment of a method for securely mounting cellular base station ground components.

Various methods may be performed using the systems and devices detailed in relation to FIGS. 1-7. FIG. 8 illustrates an embodiment of a method 800 for securely mounting cellular base station ground components. Method 800 may be performed using the mounting structures detailed in relation to FIGS. 1-7.

At block 810, the cellular component cabinet may be attached with the mounting platform. This can include one or more bolts, screws, or other types of fasteners being used to attach one or more mounting points of a support structure of the platform with matching mounting points of the cellular component cabinet. In some embodiments, welding or other permanent types of attachment may be used.

At block 820, the platform may be attached with the ground, such as by using one or more earth anchors to fasten the stabilization structure of the platform with the earth. In some embodiments, ballast may be placed atop the platform instead of or in addition to anchors being used to fasten the stabilization structure with the earth.

At block 830, a first port of the cellular component cabinet may be connected with a fiber-optic cable. Fiber-optic cable may include one or more fiber-optic strands and may serve to connect components within the cellular component cabinet with a cellular network, such as a 5G NR network. In some embodiments, multiple ports may be present that are used to connect components of the cellular component cabinet with the cellular network.

At block 840, a second port of the cellular component cabinet may be connected with components that are mounted to a cellular tower. The second port may also involve a fiber-optic cable and/or may include conductive wiring. The components that are mounted to the cellular tower can include one or more antennas, one or more cellular radios, or both. In some embodiments, multiple ports may be present to connect components of the cellular component cabinet with other components that are mounted to the cellular tower.

At block 850, power may be connected with components of the cellular cabinet. Making a power connection can include installing and wiring an electric meter. The electric meter may be mounted to an outside of the cellular component cabinet. An input to the electric meter may be connected with the electrical grid and an output of the electric meter may be connected with a power supply within the cellular component cabinet or directly with various components present within the cellular component cabinet. A fuse box or breaker box may be installed within the cellular component cabinet that can serve to interrupt the power supply received from the electric meter in case of a short-circuit or excessive power draw.

Various steps to method 800 may be performed in an alternative order. For example, it may be possible to connect ports of the cellular component cabinet with the cellular network and components mounted to the cellular tower before anchoring is complete. Likewise, it may be possible to anchor the platform to the ground prior to the cellular component cabinet being mounted with the platform.

The systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A cellular base station ground component mounting system that comprises a cellular tower and a cellular antenna, the cellular base station ground component mounting system further comprising:
   a cellular component cabinet configured to house a plurality of components of a cellular base station, wherein:
      the cellular component cabinet has a first footprint; and
      the plurality of components of the cellular base station are configured to be connected with the cellular antenna mounted to the cellular tower;
   a mounting platform, distinct from the cellular component cabinet, wherein the mounting platform defines:
      a support structure, that defines a plurality of mounting holes, mounted directly to the cellular component cabinet; and
      a stabilization structure that defines a plurality of earth anchor mounting holes configured to receive earth anchors to anchor the mounting platform to earth, wherein:
         a second footprint of the mounting platform is larger than the first footprint of the cellular component cabinet; and
         the support structure is attached with and encircled by the stabilization structure.

2. The cellular base station ground component mounting system of claim 1, wherein no concrete pad is present beneath the cellular component cabinet or the mounting platform.

3. The cellular base station ground component mounting system of claim 1, wherein the stabilization structure is triangular and the support structure comprises three supports that anchor the plurality of mounting holes with the plurality of earth anchor mounting holes.

4. The cellular base station ground component mounting system of claim 1, wherein the stabilization structure is circular and the support structure comprises three supports that anchor the plurality of mounting holes with the plurality of earth anchor mounting holes.

5. The cellular base station ground component mounting system of claim 4, wherein the three supports are arranged 120 apart within the stabilization structure.

6. The cellular base station ground component mounting system of claim 1, wherein the cellular component cabinet comprises a first port to connect with a fiber optic network and a second port to connect with components mounted on the cellular tower.

7. The cellular base station ground component mounting system of claim 6, wherein the cellular component cabinet houses 5G NR (New Radio) cellular network components.

8. The cellular base station ground component mounting system of claim 7, further comprising an electric meter that is mounted external to the cellular component cabinet.

9. The cellular base station ground component mounting system of claim 8, wherein the electric meter is mounted on top of the cellular component cabinet.

10. The cellular base station ground component mounting system of claim 1, wherein the cellular component cabinet is cylindrical.

11. A method for securely mounting cellular base station ground components, the method comprising:
   attaching a cellular component cabinet with a mounting platform, wherein:
      the cellular component cabinet is configured to house a plurality of components of a cellular base station;
      the cellular component cabinet and the mounting platform are used as part of a system comprising a cellular tower and one or more cellular antennas;
      the mounting platform is distinct from the cellular component cabinet,
      the cellular component cabinet has a first footprint;
      the mounting platform comprises a support structure that defines a plurality of mounting holes;
      the support structure is mounted directly to the cellular component cabinet using the plurality of mounting holes;
      the mounting platform further comprises a stabilization structure that defines a plurality of earth anchor mounting holes configured to receive earth anchors to anchor the mounting platform to earth;
      a second footprint of the mounting platform is larger than the first footprint of the cellular component cabinet; and
      the support structure is attached with and encircled by the stabilization structure; and
   anchoring the mounting platform by inserting ground anchors through the plurality of earth anchor mounting holes into the ground.

12. The method for securely mounting cellular base station ground components of claim 11, wherein anchoring the mounting platform is performed with no concrete pad present beneath the cellular component cabinet or the mounting platform.

13. The method for securely mounting cellular base station ground components of claim 11, wherein the stabilization structure is triangular and the support structure comprises three supports that fix the plurality of mounting holes with the plurality of earth anchor mounting holes.

14. The method for securely mounting cellular base station ground components of claim 11, wherein the stabilization structure is circular and the support structure comprises three supports that fix the plurality of mounting holes with the plurality of earth anchor mounting holes.

15. The method for securely mounting cellular base station ground components of claim 14, wherein the three supports are arranged 120° apart within the stabilization structure.

16. The method for securely mounting cellular base station ground components of claim 11, further comprising:
connecting a first port of the cellular component cabinet to a fiber optic cable and a second port of the cellular component cabinet to components mounted on the cellular tower.

17. The method for securely mounting cellular base station ground components of claim 16, wherein the cellular component cabinet houses 5G NR (New Radio) cellular network components.

18. The method for securely mounting cellular base station ground components of claim 17, further comprising:
mounting an electric meter external to the cellular component cabinet.

19. The method for securely mounting cellular base station ground components of claim 18, wherein the electric meter is mounted on top of the cellular component cabinet.

20. A cellular base station system, comprising:
one or more cellular antennas;
a cellular tower;
a cellular component cabinet configured to house a plurality of components of a cellular base station, wherein:
the cellular component cabinet has a first footprint; and
the cellular component cabinet defines a first port and a second port; and
the first port is connected with a fiber optic network and the second port is connected with the one or more cellular antennas mounted on the cellular tower;
a mounting platform, wherein the mounting platform defines:
a support structure that defines a plurality of mounting holes, wherein:
the support structure is mounted directly to the cellular component cabinet; and
a stabilization structure that defines a plurality of earth anchor mounting holes configured to receive earth anchors to anchor the mounting platform to earth, wherein:
a second footprint of the mounting platform is larger than the first footprint of the cellular component cabinet; and
the support structure is attached with and encircled by the stabilization structure.

* * * * *